Feb. 18, 1941. N. E. LINDENBLAD Re. 21,717
MODULATION
Original Filed April 5, 1932 3 Sheets-Sheet 1
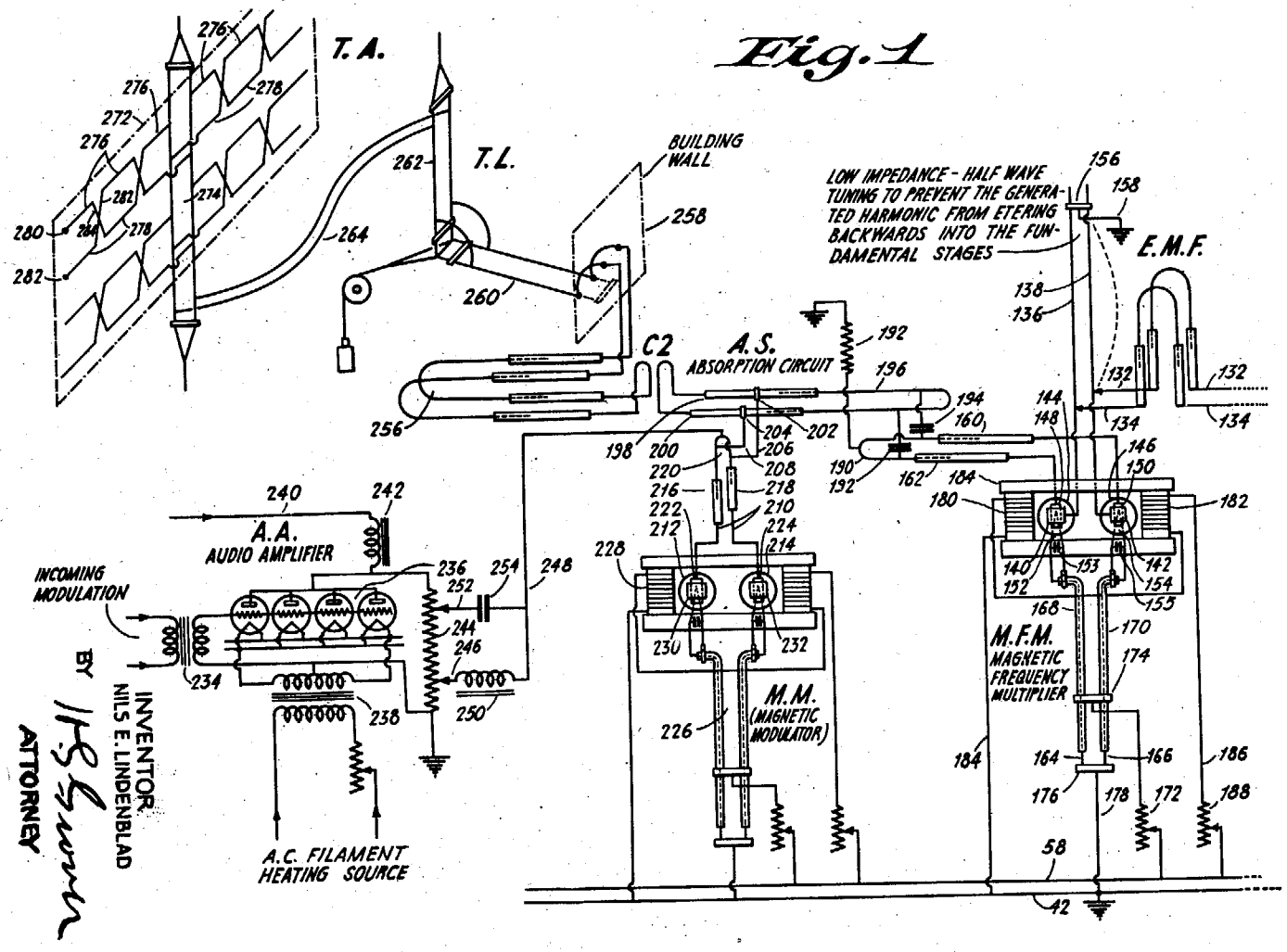
INVENTOR
NILS E. LINDENBLAD
BY H. G. Grover
ATTORNEY Feb. 18, 1941. N. E. LINDENBLAD Re. 21,717
MODULATION
Original Filed April 5, 1932 3 Sheets-Sheet 2
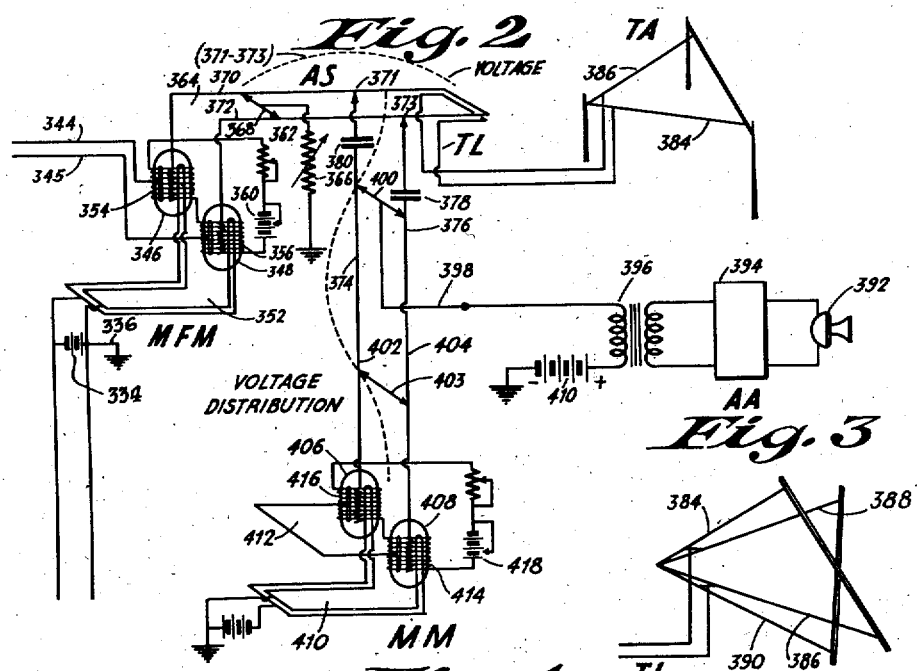
INVENTOR
NILS E. LINDENBLAD
BY H. G. Grover
ATTORNEY Feb. 18, 1941. N. E. LINDENBLAD Re. 21,717
MODULATION
Original Filed April 5, 1932 3 Sheets-Sheet 3
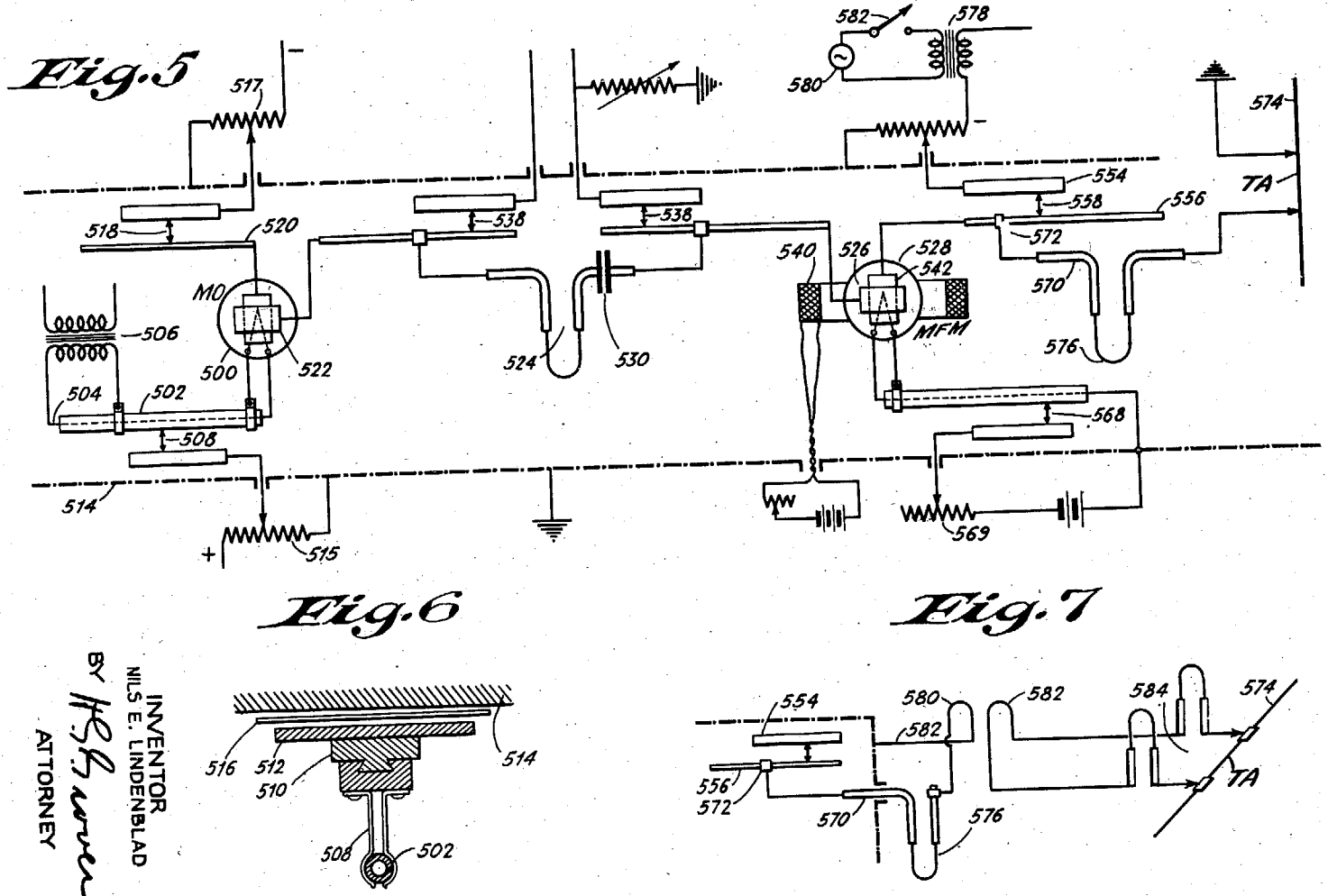
INVENTOR
NILS E. LINDENBLAD
BY H. S. Grover
ATTORNEY Reissued Feb. 18, 1941 Re. 21,717

UNITED STATES PATENT OFFICE 21,717

MODULATION

Nils E. Lindenblad, Port Jefferson, N. Y., assignor to Radio Corporation of America, a corporation of Delaware Original No. 2,061,947, dated November 24, 1936, Serial No. 698,496, November 17, 1933, which is a division of Serial No. 603,310, April 5, 1932. Application for reissue February 25, 1938, Serial No. 192,584

30 Claims. (Cl. 179—171.5)

This invention, which is a division of my copending application Serial Number 603,310, filed in the United States Patent Office, April 5, 1932, relates to the short wave signaling art and appertains especially to the modulation and electromagnetic propagation of ultra short waves, particularly in the range of wave lengths below two meters and of the order of frequencies above one hundred fifty million (150,000,000) cycles per second.

One object of my present invention is to provide a modulation system for extremely short wave length oscillations of electrical energy.

My present invention will be described more fully hereinafter from which many other objects, features and advantages of my present invention will become self apparent.

In the accompanying drawings,

Figure 1 shows a preferred embodiment of my ultra short wavelength modulator;

Figure 2 illustrates a modification of the modulation of Figure 1;

Figure 3 illustrates an alternative antenna arrangement which may be used with either of the systems shown in Figure 1 or 2;

Figure 4 illustrates still another modified modulating arrangement; and,

Figures 5, 6, and 7 illustrate still other forms of my present invention.

Turning to Figure 1, energy of fundamental frequency from any suitable source (not shown) is fed through a variable transmission line formed of conductors 132, 134 of variable length to the anode circuit or input circuit of the magnetic frequency multiplier MFM, which anode circuit is composed of conductors 136, 138 directly connected to the anodes 140, 142 of my magnetic frequency multiplier MFM. Within the electron discharge devices or vacuum tubes 144, 146 of my frequency multiplier there are also the control grids or electrodes 148, 150 adjacent the cathodes or filaments 152, 154 respectively. Condensers 153, 155 are in shunt with the filaments 152 and 154 respectively of the magnetic frequency multiplier.

To prevent the harmonics generated by the frequency multiplier from reacting (or losing energy) backwards upon the source connected to line 132, 134, the conductors 132, 134 are tied on to voltage nodal points or current maximum points or low impedance points for harmonic waves on the tuned anode circuit, of the frequency multiplier formed by conductors 136, 138. With respect to fundamental waves, the anode ends of the anode circuit are high voltage or high impedance points. These conductors are short circuited by strap 156 which in turn is grounded through conductor 158. A source of potential, may, if desired, be placed in the conductor 158 to maintain the anodes at a suitable D. C. operating potential. However, I have found in many cases, for frequency multiplication at these extremely high frequencies, namely, for example, of the order of magnitude of 150 million cycles per second, or generally, over 100,000 kc. per second, supplied from the master oscillator or other source, that the anodes 140, 142 can be grounded as illustrated.

The output circuit of the frequency multiplier is formed of conductors 160, 162 adjustable in length and tuned to a harmonic, for example, the third harmonic, or in other words, tuned for frequencies of 450,000 kilocycles per second, assuming of course that the master oscillator or other source, connected to lines 152, 154 is adjusted to operate at 150,000 kilocycles per second.

The cathode energizing circuit for cathodes 152, 154 of electron discharge devices 144, 146, consists in general of internal conductors 164, 166 insulated from and supported within the concentric external tubular conductors 168, 170. Filament heating current may be traced from conductor 58 through voltage regulating resistance 172 through tuning conductor or strap 174 through the filaments 152, 154 and back through the internal conductors 164, 166 conducting strap or short circuiting element 176 through conductor 178 to the other side or conductor 42 of the filament heating circuit bus supplied with energy from source 44.

By adjustment of straps 174 the cathode circuit is tuned for best matching with the rest of the circuits. This means it has a compromise optimum for both fundamental and harmonic frequency. The grid circuit being set for optimum impedance to harmonic energy, this energy readily feeds into and flows through the same and builds up to a large value.

Now, the frequency multiplier as so far described, namely, without the magnetic apparatus illustrated, will not deliver an appreciable output. To increase the output, I apply a unidirectional magnetic field to the electron stream within the tubes 148, 156, in a direction perpendicular to their normal paths of travel from filament to anode. The magnetic apparatus consists of a pair of solenoids 180, 182 through which runs a yoke 184, preferably of iron of high permeability which may or may not be laminated. The solenoids 180, 182 are serially connected as shown, and supplied through conductors 184, 186 with energizing currents from a line 42 by way of an adjustable resistor 188.

It is to be noted that the grids or electrode 148, 150 adjacent the cathodes 152, 154 are connected to the output circuit formed of conductors 160, 162, within which looped conductor 190 is slidably and conductively arranged for tuning purposes as well as to allow the direct current voltage, generated by grid rectification, across grounding resistor or biasing resistor 192 to manifest itself upon the control grids or electrodes.

The resistor 192 is preferably so chosen that the positive peaks of input potential applied to the anodes 140, 142 cause spurts of electrons to impinge upon the control grids or grids adjacent the cathodes. Under such circumstances, without the application of the magnetic field, the harmonic output, if any, will be very feeble. However, by the application of the longitudinally or axially applied unidirectional magnetic field, the output, at harmonic frequencies in the tuned output circuit 160, 162, 190 is materially augmented and of a substantial value.

A qualitative explanation, as well as a practical explanation of this phenomenon is that the electrons emanating from the filaments are curved in their paths and retained by the magnetic field in large quantities in suspension in the space about the cathodes and closely adjacent the control grids. Hence, when the intensity of a positive peak of applied input potential has grown to sufficient strength to bring the electrons to the grids in spite of the curving, the number of electrons which splash against the control grids is considerably larger than that number without the suspension effect. In addition, it is to be pointed out that this improved action may also be due to the fact that due to the suspending of the electrons within the space closely adjacent the control grids, there is less time difference between the electrons which travel from the space suspension to the control grids when arrayed on curves almost tangential with the grid relative to the time difference between radially arrayed electrons. These arrays are considered in the sense of the motion of the electrons and not in the sense of their actual location. At the high frequencies involved, this time lag effect is, as will be evident, very important, for, unless the electrons impinge upon the output electrodes in unison, the abruptness of variation required to produce a harmonic will never be obtained. This is perhaps better understood if it is pointed out that, the higher the frequency, the more so do the electrons which at a certain moment are confined in the space, represent the total number of electrons taking part in an oscillatory cycle. In other words, due to the extremely short time duration of a cycle relative to the electron velocity it is very important to have the motions of the electrons well disciplined so that their action in unison will overcome the handicap due to the absence of mass action which is readily obtained at lower frequencies.

Thus, the application of the unidirectional magnetic field causes a sharper impingement of electrons as well as cut off of electron flow to the output electrodes upon the start and cessation of the positive peaks of input controlling potentials and it is this sharp starting and stopping of electron flow which is responsible to a large degree for harmonic waves.

In general also, improvement in output as well as in many cases, change from non-operation to operation, or, in other words, increased efficiency is obtained by the tuning of such circuits as the filament heating circuits.

In actual construction, I have used with good success electron discharge devices with T-shaped glass envelopes, the longitudinal axes of the anodes of which are substantially parallel to the longitudinal axes of the solenoids 180, 182. Portions of the tube also have been made to extend through openings or orifices drilled into or through the magnetic yokes, so that the field intensity applied is increased, and so that leakage flux is materially reduced.

It is also to be pointed out in connection with my improved frequency multiplier that the grids or electrodes adjacent the cathodes, have been chosen as output electrodes rather than the anodes. With respect to the fundamental input, because the capacity coupling between the electrodes, that is, between grids and plates, is so great it is immaterial whether the fundamental input is applied to the grids or the plates.

Odd harmonics are fed into the absorption circuit or modulation link circuit AS and eventually transmitted by means of transmitting antenna TA.

For telegraphic signalling, at some point intermediate the antenna and the output circuit of the frequency multiplier, known forms of keying apparatus may be inserted, or known types of chopper wheels for that purpose.

For complex wave modulation however, such as voice modulation, or multiplex signalling, it will be found that the ordinary or conventional schemes of modulation as already pointed out, fail because of inordinate frequency variation in the final output.

Accordingly, a very important feature of my present invention is my improved modulating system comprising, as illustrated, the absorption circuit or systems AS and the magnetic modulator MM.

The harmonic frequency output is taken from points of relatively high impedance in the output circuit comprising loop 190 through blocking condensers 192, 194 and fed to points of a similar high impedance in the absorption circuit AS. The absorption circuit AS comprises a conductive loop 196 slidable within conductors 198, 200. This absorption circuit is tuned by adjustment of the loop 196 within the conductors, 198, 200 to the harmonic frequency.

Because of the tuned and closed condition of the absorption circuit, it is obvious that standing waves are set up thereon. To points of high and preferably maximum potential, 202, 204, in the absorption circuit, I couple through conductors 206, 208 the tunable control grid circuit 210 of electron discharge devices 212, 214 forming part of my improved modulation system.

As illustrated, the tuned circuit 210 consists of conductors 216, 218 within which and conductively in contact therewith is slidable loop 220 for tuning purposes. The conductors 216, 218 are connected respectively to the control grids 222 and 224 of electron discharge devices 212, 214.

As the filament energizing or cathode energizing circuit 226 of my magnetic modulator is identical with that of the cathode energizing circuits heretofore described in connection with my frequency multiplier, I shall not describe the same in detail again. Similarly, the magnetic apparatus for applying a unidirectional magnetic field to the modulator tubes 212, 214, is identical with that utilized with the frequency multiplier, and the magnetic apparatus 228, for the magnetic modulator, need not be again described.

It is to be noted in connection with the magnetic modulator, that the anodes 230, 232 are floating, that is, left disconnected. However, if desired, a tuned circuit similar to any of the anode circuits described hereinabove, may be connected thereto. Now, it will be found that if it is attempted to modulate, with conventional schemes, the energy in the absorption circuit, for example, by by-passing that circuit to ground through a variable impedance in the form of electron discharge devices, variations in the direct current through the impedance device in accordance with modulating potentials will produce only infinitesimal effects upon the energy in the absorption circuit. This is due to the fact that the capacitance of the device prevents any appreciable electron moving voltage to build up at these very high frequencies. Only by careful lining up of the electrons will it be possible to make them respond to these small voltage variations. Moreover, the low electron velocity within the ordinary tubes also mitigates against their use as modulators.

However, with my improved tube absorbing circuit comprising tubes 212, 214, modulation is readily accomplished as the characteristics of the tubes are greatly changed, with the application of the magnetic field thereto.

In other words, by causing the electrons to be suspended in orbits near the grid, due to the effect of the magnetic field, a greater number of electrons are available to be effected by modulating potentials.

The grids are in this case preferably supplied with a positive bias so that they at all times are positive. In this way, electrons of tangential motion versus the grid are at all times available in great numbers in the extreme vicinity of the grid so that even though low, potentials of high frequency can spend work on the same with the result that absorption takes place. To vary the potential level upon the control grids of the magnetic modulator, thereby varying the absorption of energy by making a greater or smaller number of electrons available and thereby accomplishing modulation of the waves in the absorption circuit, incoming modulation from a source (not shown) is applied through a transformer 234 to a plurality of electron discharge device amplifiers 236 connected in parallel. These audio frequency amplifiers may have their filaments energized by a source of alternating currents (not shown) through a transformer 238. Anode potential is supplied through conductor 240 from a source (not shown) in which there is serially connected a choke coil 242 for audio frequency currents. This choke insures the flow of the varying amplified modulating currents through a potentiometer or resistor 244.

The fixed or normal bias on the control grids of the modulator tubes is derived from resistor 244 through variable tap 246 and conductor 248. A choke 250 is placed in series with a conductor 248 for a purpose which will be explained more fully hereinafter.

As the tapping point 246 giving a correct D. C. bias level for the grid electrodes of the magnetic modulator tubes may be erroneously placed as regards desired audio voltages which it is desired to apply to the control grids, the choke 250 as already indicated, has been placed in series with conductor 248. This choke prevents the flow of substantially all audio frequency currents or potentials from point 246.

However, to apply the high audio frequency potentials arising at point 252 to the modulator control grids, I connect conductor 248 to that point through an audio frequency by-passing condenser 254, which of course is relatively large as compared to a radio frequency by-pass condenser. Thus, by means of this condenser-choke coil arrangement tapped on to resistor 244, I am enabled to apply at the same time to the control grids of the magnetic modulator, the desired high audio frequency voltage and the relatively low value unidirectional polarizing potential.

As already pointed out, the variations in potential on the control grids of the magnetic modulator tubes vary the amount of energy absorbed from the absorption circuit, as a result of which through adjustable coupling C—2 and transmission line 256 there is fed to the transmitting antenna TA an amplitude modulated wave of substantially constant frequency.

The transmission line construction TL follows the construction given in my copending United States patent application Serial Number 463,610, filed June 25, 1930. Briefly, the modulated harmonic frequency carrier energy travels through transmission line 256 through building wall 258 over transmission lines 260, 262 and 264 to the feeder wires 274 for radiating or transmitting antenna TA, which is provided with a smooth plane metallic reflector 272.

The transmitting antenna comprises a plurality of linear radiators 276 each substantially one-half wave length long arranged coaxially with each other and parallel to another group of half wave radiators 278. The radiators 278 are also coaxial with each other parallel to the radiators 276. As indicated, the radiators 276, 278 are formed by bending single conductors 280, 282. These conductors are so bent that alternate half wave portions thereof form radiating portions as indicated, the cross portions at 282, 284 being substantially parallel and close together produce substantially cancelling radiations. Hence, by analysis it will be found that the instantaneous currents in the radiating portions 276, 278 are in like phase as a result of which a bi-directional radiant characteristic is obtained. This bi-directional characteristic is reduced to a unidirectional characteristic by placing a metallic reflector 272 behind the plane formed by the radiating conductors 276, 278 which are arranged in the same linear plane. The spacing between the antenna system and the smooth metallic reflecting sheet 272 is preferably made substantially one-quarter wave length although any substantially odd quarter wave length spacing will produce the desired result. By means of insulators, the radiators may be supported upon the reflector, the insulators being fixed to voltage nodal points on the conductors, for example, the midpoints of radiators 276, 278 and the cross-over points of the conductors 280, 282.

To concentrate the beam, several radiating systems may be placed one above the other as illustrated. Energization is accomplished through the common feed line 274 as is apparent from an inspection of the drawings. This feed line 274 is formed of a pair of conductors as illustrated, short circuited at their far ends, the input feed from transmission line 264 being at a point of relatively high input impedance on the feed lines 274. The input points to the antenna sections are of low impedance. The aforementioned short circuits are a quarter wave beyond the working length of the feed line 274 thus forming a high impedance suspension link.

Because of the extremely short wave lengths involved, propagation follows the optical laws fairly close. Consequently, radiation in general, is in a more or less straight line. The reflector and antenna may be tilted at any angle so as to project, say, a beam of waves upon a smooth plane reflector situated, say, on the top of a high tower. The reflector mounted on the tower will in turn reflect the waves at an angle of reflection equal to the angle of incidence thereon. For example, a transmitting antenna TA may be pointed to a reflector on top of a tower some 500 feet high. The reflector may be so positioned that the beam is propagated horizontally until due to the curvature of the earth, it approaches the surface of the earth. At this point another reflector may be provided to say, turn the direction of the beam at right angles to the direction up to that point, to a suitable receiver located at some distant point. Preferably, however, due to unavoidable losses during reflection, I prefer to place the transmitting antenna as high as possible and point it directly at a receiving station which may or may not be located in a similar tower. One may also build up systems of curved reflectors with common foci or wire systems with refractive properties, etc.

For repeating any form of bi-direction antenna may be used, for example, if an antenna has two main characteristic "ears" the one can be used for the incoming signal and the other to repeat it in another direction. Even unidirectional antennae may be used providing the incoming and repeated signals are on the same side of the antenna system.

A modified form of my invention for modulating waves of the order in frequency of 450,000 kilocycles per second, is illustrated in Figure 2.

Filament heating or energizing energy for the magnetic frequency multiplier MFM is supplied by way of a circuit 352 from a source 334 which, though illustrated as a battery, may obviously be any form of unidirectional current. Unidirectional current, of course, for this purpose is preferred although A. C. types of filaments may be utilized. One end of the filament energizing source is grounded as shown at 336.

Fundamental frequency energy is applied to the anodes of the magnetic frequency multiplier MFM, from a suitable source (not shown) connected to the line or conductors 344, 346. Tuning of the anode circuit of the magnetic frequency multiplier tubes 346, 348 may be accomplished as in Figure 1 by variation of adjustable slides in the anode circuit not shown. The heating circuit 352 of the magnetic frequency multiplier MFM is tuned for best matching for the rest of the circuit. This tuning may or may not be either the fundamental or harmonic frequency which it is desired to produce.

The magnetic field, longitudinally applied to the tubes 346, 348 in the arrangement shown in Figure 2 is accomplished by the action of solenoids 354, 356 which may be wrapped about or simply placed about the tubes 346, 348. Moreover, if desired, the solenoids may be provided with magnetic cores or the magnetic arrangement may take the form described in connection with Figure 1. The intensity of the magnetic field is, of course, controlled by the variation of either or both of source 360 and resistor 362.

The coupling from circuit AS to the absorber or modulator tubes 406 and 408 is shown in a simplified way. Through the action of resistor 366 suitable grid bias is maintained upon the grids of the tubes 346, 348, the resistor being connected to a short circuiting conductor 368 variable along the conductors 370, 372 forming part of the circuit AS as well as the tuned grid circuit. The grid circuit as in Figure 1, forms the output circuit of the magnetic frequency multiplier, the short circuiting strap 368 being connected as indicated across voltage nodal points on the circuit AS whereas the conductors 374, 376 connected to the circuit AS through bypassing condensers 378, 380 are connected to this circuit at voltage maximum points 371, 373 thereon, or in other words, at high impedance points.

Modulated harmonic frequency energy is taken from the circuit AS through transmission line TL inductively coupled thereto which, in turn, is also coupled to transmitting antenna TA formed of conductors 384, 386. This antenna is described more fully in my copending application Serial No. 328,147, filed Dec. 24, 1928, patented September 19, 1933, No. 1,927,522.

Briefly, due to the nature of wires which are long relative to the wave length and due to the relative location of these wires and their relative phase, it will be found that energy is propagated predominantly along the bisector of the angles formed by the conductors 384, 386. The attenuation in the conductors at the high frequencies involved is so great for wires 100 waves long, that there is substantially no reflection, as a result of which no reflector formed of a similar pair of conductors, is required.

The antenna line TL may be coupled as illustrated in Figure 3 to pairs of conductors similar to 384, 386, each pair, of course, being arranged in a different plane. In Figure 3, the conductors 384, 386 are in one plane whereas conductors 388, 390 are in another plane. These planes may be the horizontal or vertical planes or any planes intermediate the two. The transmitting antenna TA of Figure 2 may, of course, be arranged in either a horizontal or vertical plane, and the antenna system of Figure 3 may be rotated any angle about the bisector of the solid angle formed by the conductors.

Modulation, as already indicated, is accomplished by absorbing variable amounts of energy corresponding to amplitudes of the modulating potentials, from circuit AS by means of modulator or absorber tubes 406, 408. In particular, amplified modulating potentials from, for example, microphone 392, are fed to an audio amplifier 394, which, through the action of transformer 396, impresses those potentials through conductor 398 short circuiting strap 400 and conductors 402, 404, to the grid of electron discharge devices 406, 408 of my magnetic modulator. To make doubly sure no fundamental energy gets through and becomes modulated to give back reaction, short circuiting conductor 403 is provided.

To maintain proper bias upon a control grid upon magnetic modulator MM, a unidirectional source of potential 410 is provided. As before, the cathode energizing circuit 418 of the magnetic modulator MM is tuned. The anodes of electron discharge devices 406, 408 of the magnetic modulator may be left "floating" that is, completely disconnected, or short circuited by short circuit 412. However, if desired, circuit 412 may be tuned to the harmonic or, in other words, to the same frequency as that to which the absorption circuit AS, MM is tuned.

The solenoids 414 are energized by a source 418 and produce a unidirectional magnetic field which, of course, is applied to the electron flow within the modulator tubes 406, 408.

As I have already pointed out, my improved magnetic modulator is the only arrangement wherein desired variable absorption from the transfer circuit AS can take place.

Certain circuit re-arrangements of this modulator arrangement may be made as for instance illustrated in Figure 4. Modulating potentials in the arrangement shown in Figure 4 are applied to the grid-cathode circuit connected to the parallel connected modulator tubes 420. Direct current potential for both the modulator tubes 420, the magnetic modulator MM, for which, by the way, the magnetic apparatus has been omitted for the sake of simplicity, is supplied through conductor 422. The modulator reactor 424 is chosen so as to have practically no D. C. resistance. Consequently, the grids and filaments of the modulator tubes 426, 428 will be at the same D. C. potential except for the drop in D. C. potential across resistor 430. However, since the current drawn through choke 424 is constant through its inherent action, the voltage across resistor 432 connected between the anodes and cathodes of the modulator tubes 420, will vary according to the modulating potentials due to the varying current flows therein. Consequently, the voltage upon the grids of the modulator tubes 426, 428 will vary as a result of which varying amounts of current will be drawn from the absorption circuit AS.

The arrangement shown in Figure 4 offers the advantage that blocking condensers, such as condenser 254 of Figure 1, in a modulation circuit is unnecessary. Moreover, this arrangement shown in Figure 4 has the added advantage that, because of resistance coupling, the circuit is extremely stable, is of fine fidelity, and greatly simplifies operation.

Although I have shown the filament tuning conductors to be the means for conveying heating currents to the filaments of the various tubes, heating currents may be supplied through chokes to the filaments, the tuning conductors in that case carrying only high frequency currents and if desired blocked off from the heating currents by means of large blocking condensers.

My present invention, however, is not limited to push-pull tube arrangements, but may be applied equally as well to single tube arrangements. Also it is not limited to amplitude modulation. For example in Figure 5 I have illustrated diagrammatically an arrangement wherein single tube stages are utilized and wherein the ensuing output is frequency modulated.

The arrangement shown in Figure 5 utilizes a master oscillator MO supplying an improved single tube magnetic frequency multiplier MFM whose output is frequency modulated and fed to a suitable transmitting antenna TA.

Cathode heating energy for the cathode of the master oscillator tube 500 is supplied through concentric conductor 502, tubular in form, and internal conductor 504 after being impressed thereon through the medium of transformer 506. The potentiometer 515 is really not needed if the potentiometer 517 is present in the grid circuit. The filament of tube 500 may be heated by direct current and the arrangement shown in connection with tube 528 may be used wherein the potentiometer 569 serves the dual purpose of regulating cathode bias and cathode heating current. It is to be clearly understod that either arrangement may be used on either tube.

The slider 508 contacting with tube 502 and slidable along grounding strip 510 (see Figure 6) in turn fastened to grounding plate 52 insulatingly separated from the shield or container 514 by means of the condenser dielectric strip 516, is used to tune or adjust the impedance of the cathode high frequency circuit formed by the tube 502 and in effect ground 514.

A similar sliding arrangement 518 is used to tune the grid circuit comprising linear conductor 520.

High frequency oscillations generated by the master oscillator are fed from the anode 522 through the adjustable tuning trombone 524, D. C. blocking condenser or radio frequency bypassing condenser 530 to the input electrode or anode 526 of the magnetic frequency multiplier tube 528. The anode circuits of the master oscillator 500 and the magnetic frequency multiplier are formed similarly to the cathode circuit of the master oscillator and are similarly tuned by means of adjustable sliders 538.

The magnetic frequency multiplier MFM operates similarly to the magnetic frequency multipliers hereinabove described and is provided with a solenoid 540 in order to apply longitudinally of the tube 528, a unidirectional magnetic field. The output electrode 542 is the normal grid electrode or electrode adjacent the cathode of the tube 528 and is tuned to a harmonic of the input frequency by means of slider 558. The cathode circuit of the magnetic frequency multiplier is adjusted in impedance by means of a slider 568 so that the potentials arising thereon have the most beneficial phase relation for harmonic production in the output circuit including conductors 556 and capacitively grounded strip 554. The output conductor 570 is tapped to a point 572 in the output circuit for most efficient energy transfer to the radiating linear antenna 574 as illustrated, the transmission line 570 containing an adjustable trombone slide 576. For more perfect balancing, this coupling may be inductive rather than conductive.

In the arrangement illustrated in Figure 5 (and this is true of any of the arrangements heretofore described) frequency modulated energy may be obtained by simply varying the voltage on any of the cold electrodes of the magnetic frequency multiplier and/or master oscillator. The frequency variation thus obtained is at these very high frequencies very much greater in magnitude than the inherently obtained amplitude modulation. For this purpose, in connection with Figure 5, the voltage on the cold electrode 542 of the magnetic frequency multiplier, is wobbled by means of transformer 578 supplied with alternating currents from a suitable source 580 and keyed by means of a keyer 582. This alternating voltage from source 580 is superimposed upon the unidirectional voltage impressed upon cold electrode 542.

Similar results could be obtained by inserting the transformer 578 in the anode lead of tube 528, or in the anode or control electrode leads of the master oscillator tube 500, or, in connection with the pushpull arrangements, any similar polarizing leads. It is also to be clearly understood that the source of alternating currents 580 and the keyer 582 may be replaced by a microphone or similar source of alternating currents.

The alternating modulating potentials may also be applied in series with the source of energy energizing the solenoid 540 for modulating purposes.

In the event that it is desired to radiate from linear radiator 574 an amplitude modulated wave, an absorption system employing the principles hereinbefore delineated is preferably utilized.

Should it be desired to use a push pull absorption scheme, the output circuit may be arranged as shown in Figure 7.

Then, the output trombone 576, is connected to output inductor loop 580 grounded by means of conductor 582. The antenna 574 is coupled to the loop 580 by adjustable loop 582 and adjustable transmission line 584. For amplitude modulation purposes, energy may be drawn from line 584 as illustrated by the tube arrangement heretofore described.

Although various modifications of my present invention have been described, it is not limited thereto since many changes will readily suggest themselves to those skilled in the art. For this reason and since it would be impractical to illustrate every modification of my present invention, it should be clear that it is not to be restricted by the exact descriptions and illustrations given, but solely by the breadth of the appended claims.

Having thus described my invention, what I claim is:

1. In a modulating system comprising a circuit having high frequency currents flowing therein, and, an electron discharge device having an electrode adjacent its cathode connected by a high frequency connection to said circuit for varying the flow of currents in said circuit, the method of varying the amplitude of current flowing in said circuit which includes varying the voltage on said electrode adjacent the cathode of said device, in accordance with variations to be imparted to the high frequency currents flowing in said circuit, and, subjecting the electron stream within said device to a unidirectional magnetic field.

2. A system for absorbing high frequency energy from a high frequency circuit comprising an electron discharge device having an electron emitting cathode, and a control electrode, a circuit connecting said control electrode to said high frequency circuit, and a circuit connected with said control electrode for varying the potential on said control electrode whereby said control electrode-cathode circuit absorbs energy from said high frequency circuit in accordance with the varying potential applied to said control electrode.

3. In combination, a tuned high frequency circuit having a high frequency voltage maximum point, and means for varying the flow of high frequency currents in said circuit at a relatively low frequency rate comprising an absorbing circuit connected to said high frequency circuit at said voltage maximum point, said absorbing circuit comprising the impedance between the cathode and a cold electrode in an electron discharge device, said cathode emitting electrons to said cold electrode and means for subjecting the emitted electrons to a unidirectional magnetic field.

4. A modulating system comprising a high frequency circuit having voltage maximum points, said circuit having flowing therein high frequency currents to be modulated, a pair of electron discharge devices each having an electron emitting cathode and a cold electrode, means connecting said cold electrodes to voltage maximum points in said high frequency circuit, means for subjecting the electron streams within said devices to unidirectional magnetic action, and, means for varying the conductivity of said devices thereby varying the amount of energy diverted from said high frequency circuit.

5. Apparatus as claimed in claim 4 wherein the cathodes of said devices are connected together by a circuit "tuned" to a frequency corresponding to that of said first mentioned high frequency circuit.

6. Means for modulating high frequency oscillations in a high frequency circuit comprising a pair of electron discharge devices each having an electron emitting cathode, and, a cold electrode; a tuned circuit connecting said cold electrodes together and to a point on said high frequency circuit, a circuit including a reactance to said high frequency oscillations connecting said cathodes together, circuits connecting a point on said high frequency circuit and a point on said last named circuit to points of similar radio frequency potentials and means for applying a magnetic field to the electron streams within said devices.

7. In a modulating system comprising a tuned circuit having high frequency currents flowing therein, and, an electron discharge device having an electrode adjacent its cathode connected by a high frequency connection to a point on said tuned circuit for varying the flow of currents in said circuit, the method of varying the amplitude of current flowing in said circuit which includes varying the voltage on said electrode adjacent the cathode of said device, in accordance with modulating potentials to be impressed on the high frequency currents flowing in said circuit, and simultaneously subjecting the electron stream in said device to a unidirectional magnetic field of substantially constant strength perpendicular to the path of said electron stream.

8. Modulating apparatus to be used with a high frequency circuit comprising an electron discharge device including an electron emitting cathode and an auxiliary electrode, a circuit connecting said auxiliary electrode to said high frequency circuit and to a point of substantially fixed radio frequency potential, a circuit connecting said electron emitting cathode to a point of substantially fixed radio frequency potential, means to tune said last named circuit to resonance at the frequency of said high frequency circuit, whereby said cathode oscillates at said high frequency relative to said point of fixed potential, and means for applying modulating potentials to said auxiliary electrode.

9. Means for modulating ultra high frequency oscillations comprising an electron discharge device having an electron emitting cathode and an auxiliary electrode, a circuit connecting said auxiliary electrode to a point of substantially fixed radio frequency potential, means for tuning a portion of said last named circuit to resonance at the frequency of said ultra high frequency to be modulated, a tuned circuit connecting said cathode to said point of fixed radio frequency potential whereby relative oscillations at said ultra high frequency between at least one of said electrodes and said point is produced, and means for applying modulating potentials to the auxiliary electrode.

10. Modulating apparatus comprising a pair of electron discharge devices each having an electron emitting cathode and an auxiliary electrode, circuits connecting the auxiliary electrodes of said discharge devices together and to a point of substantially fixed radio frequency potential, circuits connecting said cathodes of said devices together and to a point of substantially fixed radio frequency potential, means for tuning each of said last named circuits to resonance at ultra high frequency, whereby said cathodes oscillate relative to said point of substantially fixed radio frequency potential, and a circuit for applying modulating potentials between said auxiliary electrodes and said cathodes.

11. Modulating apparatus as recited in claim 10, in which the circuits connecting said auxiliary electrodes together are each turned to resonance to ultra high frequency.

12. Modulating apparatus as recited in claim 8, including means for producing a magnetic field of substantially fixed strength in the path along which the electrons emitted by said cathode when energized flow.

13. Modulating apparatus as recited in claim 8, in which a source of potential is connected to said electron emitting cathode by way of said circuit connecting said cathode to a point of substantially fixed radio frequency potential.

14. In a modulating system to be used with a high frequency circuit, an electron discharge device including an electron emitting cathode and an auxiliary electrode, a circuit connecting said auxiliary electrode to said high frequency circuit and to a point of substantially fixed radio frequency potential, a circuit connecting said electron emitting cathode to a point of substantially fixed radio frequency potential, a reactance in said last named circuit which offers a high impedance to the flow therein of oscillations of a frequency of the order of the frequency to which said ultra high frequency circuit is tuned, and means for applying modulating potentials to said auxiliary electrode.

15. A modulating system as recited in claim 14 in which a capacity and inductance is included in said last named means.

16. In a modulating system to be used with an ultra high frequency circuit, an electron discharge device including an electron emitting cathode and an auxiliary electrode, a circuit connecting said auxiliary electrode to said ultra-high frequency circuit and to a point of substantially fixed radio frequency potential, a circuit connecting said electron emitting cathode to a point of substantially fixed radio frequency potential, a reactance in said last named circuit of high impedance to oscillations of a frequency of the order of the frequency of said first named circuit, means for applying modulating potentials to said auxiliary electrode, and means for applying a magnetic field to the electron stream within said device.

17. A modulating apparatus as recited in claim 10 including means for applying a magnetic field of substantially fixed strength to the electron streams within said devices.

18. In a signalling system, a first tuned high frequency circuit, an electron discharge device having an electron emitting electrode and a grid-like electrode in the emission path of said emitting electrode, a second tuned circuit connecting said grid-like electrode to a point on said tuned high frequency circuit, an impedance connecting a different point on said tuned high frequency circuit to a point of fixed high frequency potential, a third tuned circuit of high impedance to oscillations of the frequency to which said first named circuit is tuned connected between said electron emitting electrode and said point of fixed high frequency potential, a source of heating current for said emitting electrode connected to said third named circuit and means for varying the impedance of said device at signal frequency.

19. In a signalling system, a tuned high frequency circuit, a pair of electron discharge devices, each having an electron emitting electrode and a grid-like electrode in the emission path of said emitting electrode, a second tuned circuit connecting said grid-like electrodes to spaced points on said first named high frequency circuit, an impedance connecting different points on said high frequency circuit to a point of fixed high frequency potential, a third tuned circuit of high impedance to oscillations of the frequency to which said first named tuned circuit is tuned, connected between said electron emitting electrodes and said point of fixed high frequency potential, a source of heating current for said emitting electrodes connected to said third named circuit and means for varying the impedances of said electron discharge devices at signal frequency.

20. In a signalling system a tuned high frequency circuit, a pair of electron discharge devices, each having an electron emitting electrode, a grid-like electrode in the path of emission of said emitting electrode and a plate-like electrode, a second tuned circuit connecting said grid-like electrodes to spaced points on said first named high frequency circuit, an impedance connecting different points on said first named high frequency circuit to a point of fixed high frequency potential, a third tuned circuit, on high impedance to oscillations of the frequency to which said first named tuned circuit is tuned, connected between said electron emitting electrodes and said point of fixed high frequency potential, a source of heating current for said emitting electrodes connected to said third named circuit, a circuit of low impedance connected between said plate-like electrodes and means for varying the impedance of said devices at signal frequency.

21. A signalling system as recited in claim 19 in which the impedances of said devices are varied in phase at signal frequency.

22. A signalling system as recited in claim 20 wherein the impedances of said devices are varied in phase at signal frequency.

23. In a modulation system, a source of high frequency oscillations to be modulated, an output circuit, a transmission line comprising two conductors coupling said source to said output circuit to supply wave energy from said source to said output circuit, a pair of electron discharge devices each having an electron emitting cathode and an auxiliary electrode, separate means coupling each of said auxiliary electrodes to a different conductor of said line, a source of modulating potentials, and means for varying the conductivity of said devices in phase in accordance with potentials from said source of modulating potentials.

24. A system as recited in claim 23 wherein the coupling means between said line and auxiliary electrodes are substantially a multiple of a quarter wave length long.

25. Modulating apparatus comprising a pair of electron discharge devices each having an electron emitting cathode and an auxiliary electrode, separate means coupling said auxiliary electrodes to a line in which radio frequency wave energy to be modulated flows, circuits connecting the auxiliary electrodes of said discharge devices together and to a point of substantially fixed radio frequency potential, circuits connecting said electron emitting cathodes together and to a point of substantially fixed radio frequency potential, and a circuit for applying modulating potentials between said auxiliary electrodes and said cathodes.

26. In a system for absorbing from a high frequency line, an amount of high frequency wave energy controllable at signal frequency to thereby produce amplitude modulated high frequency wave energy, a line comprising two conductors, a source of high frequency wave energy, means coupling a terminal of each of said conductors to said source, said source impressing high frequency exciting energy on said conductors to produce in said line, high frequency oscillating voltages of the frequency of said high frequency wave energy, a load impedance coupled to the free terminals of said conductors, a pair of electron discharge devices each having an electron emission element and an additional element, a high frequency connection between the additional element of one of said devices and a point on one of said first conductors, a high frequency connection between the additional electrode of the other of said devices and a point on the other of said conductors, means connecting the emission elements of said devices together, a source of modulating potentials, and means connecting said source of modulating potentials to said devices to vary the impedances thereof in phase in accordance with the said modulating potentials to thereby vary the amount of high frequency wave energy absorbed by said devices from said line comprising said two conductors.

27. In a system for absorbing from a line, an amount of high frequency wave energy controllable at signal frequency to thereby produce amplitude modulated high frequency wave energy, a transmission line comprising two conductors of a length which is a multiple of a quarter wave length of the high frequency wave energy, a coupling impedance excited by high frequency wave energy to be modulated connecting a terminal of one of said conductors to a terminal of the other of said conductors to produce in said line, high frequency oscillating voltages of the frequency of said high frequency wave energy to be modulated, a load impedance coupled to the free terminals of said conductors, a pair of electron discharge devices each having an electron emission element and an additional element, a high frequency connection between the additional element of one of said devices and a point on one of said conductors, a high frequency connection between the additional electrode of the other of said devices and a point on the other of said conductors, means connecting the emission elements of said devices together and to both of said conductors, a source of modulating potentials, and means connecting said source of modulating potentials to said devices to vary the impedances thereof in phase in accordance with the said modulating potentials to thereby vary the amount of high frequency energy absorbed by said devices from said line comprising said two two conductors.

28. In an amplitude modulation system, a source of high frequency wave energy of substantially constant frequency, a transmission line comprising two linear conductors each of a length which is a multiple of a quarter wave length of the high frequency wave energy of said source, a coupling reactance excited by high frequency wave energy from said source to be modulated connecting a terminal of one of said conductors to a terminal of the other of said conductors to produce in said line, high frequency oscillating voltages of the frequency of said high frequency wave energy to be modulated, a load impedance coupled to the free terminals of said conductors, a pair of electron discharge devices each having an electron emission element and an additional element, a high frequency conductor connecting the additional element of one of said tubes to a point on one of said first conductors, a high frequency conductor connecting the additional electrode of the other of said tubes to a point on the other of said first conductors, means connecting the emission elements of said devices together and to both of said first named conductors, a source of modulating potentials, and means connecting said source of modulating potentials to said tubes to vary the impedances thereof in phase in accordance with the said modulating potentials to thereby vary the amount of high frequency energy absorbed by said tube from said line comprising said two conductors.

29. In a short wave length modulation system, a load impedance, a two-wire line having one terminal connected to said load impedance, means for causing high frequency wave energy to flow in said two-wire line to supply energy from said line to said load impedance, and means for modulating the energy in said line and consequently the energy supplied to said load impedance comprising a pair of electron discharge devices each having an electron emitting cathode and a plurality of auxiliary electrodes, means coupling one of said auxiliary electrodes in one of said devices to one of the wires of said line, means coupling the corresponding auxiliary electrode in the other of said devices to the other wire of said line, means connecting the cathodes of said devices together, a connection between corresponding auxiliary electrodes of said devices, an impedance connected between said last named connection and the said means connecting the cathodes of said devices together whereby the impedances between said last named corresponding electrodes and the cathodes of said devices are in parallel, and means for impressing modulating potentials on said last named impedance to control the conductivity of said devices in phase at signal frequency to thereby control the amount of high frequency energy absorbed from said two-wire line by said devices.

30. In a short wave length modulation system, a load impedance, a two-wire line having one terminal connected to said load impedance, means for causing high frequency wave energy to flow in said two-wire line to supply energy from said line to said load impedance and means for modulating the energy in said line and consequenty the energy supplied to said load impedance comprising a pair of electron discharge devices each having an electron emitting cathode and a plurality of auxiliary electrodes, means coupling one of said auxiliary electrodes in one of said devices to one of the wires of said line, means coupling the corresponding auxiliary electrode in the other of said devices to the other wire of said line, means connecting the cathodes of said devices together, a connection between corresponding auxiliary electrodes of said devices, an impedance connected between said last named connection and the means connecting said cathodes together whereby the impedances between said last named corresponding auxiliary electrodes and the cathodes of said devices are in parallel, a source of modulating potentials, an electron discharge device having an anode, a cathode, and a control grid, means connecting the anode of said additional electron discharge device to said impedance, and means for impressing modulating potentials from said source of modulating potentials on the control grid and cathode of said additional device to thereby modulate the impedance of said additional device at signal frequency and consequently control the amount of high frequency energy absorbed from said two-wire line by said first named pair of devices at signal frequency.

NILS E. LINDENBLAD.